United States Patent [19]
Suder et al.

[11] Patent Number: 6,140,718
[45] Date of Patent: *Oct. 31, 2000

[54] COMPLIMENTARY DRIVER CIRCUIT WITH SHARED VOLTAGE BREAKDOWN PROTECTION

[75] Inventors: Edward C. Suder, Mesquite; Marco Corsi; James M. Tran, both of Dallas, all of Tex.

[73] Assignee: Texas Instruments Incorporated, Dallas, Tex.

[ * ] Notice: This patent is subject to a terminal disclaimer.

[21] Appl. No.: 08/301,926

[22] Filed: Sep. 7, 1994

[51] Int. Cl.$^7$ .................................................. H03K 17/16
[52] U.S. Cl. .......................... 307/412; 326/26; 326/82; 326/89; 327/309; 327/502
[58] Field of Search ............................. 307/412; 326/26, 326/82, 89, 130, 78; 327/309, 310, 314, 530, 538, 545, 502

[56] References Cited

U.S. PATENT DOCUMENTS

| | | | |
|---|---|---|---|
| 4,806,800 | 2/1989 | Khan | 326/78 |
| 4,931,672 | 6/1990 | Khan | 326/78 |
| 4,980,582 | 12/1990 | Waller et al. | 326/78 |
| 5,173,621 | 12/1992 | Fraser et al. | 326/78 |

*Primary Examiner*—Albert W. Paladini
*Attorney, Agent, or Firm*—Gerald E. Laws; W. James Brady, III; Frederick J. Telecky, Jr.

[57] ABSTRACT

This is a driver circuit 100 for use in an integrated circuit 10 for driving two complimentary signals on output terminals 104 and 106. A single device, such as a Schottky diode 170, prevents voltage breakdown resulting from an externally supplied voltage on either output terminal 104, 106. The single device, such as Schottky diode 170, provides voltage breakdown protection for an output transistor 150 and a complimentary output transistor 152.

The single device can be made larger than if two devices were used so that a voltage drop across the device resulting from normal forward current conduction is minimized.

13 Claims, 3 Drawing Sheets

COMPLIMENTARY DRIVER CIRCUIT WITH SHARED VOLTAGE BREAKDOWN PROTECTION

FIELD OF THE INVENTION

This invention is in the field of semiconductor integrated circuits and relates primarily to driver circuits for driving complimentary signal pairs.

BACKGROUND OF THE INVENTION

Multiple computer systems and peripheral input/output systems are often interconnected to allow data to be transferred among the various systems. Several different types of interconnect means are commonly used to connect to the multiple computer and peripheral systems, hereinafter referred to as "nodes." An interconnect may comprise a single data channel, referred to as a serial data interconnect, or the interconnect may comprise multiple data channels, referred to as a parallel data interconnect. Each node may typically drive signals onto the interconnect that are then received by one or more of the other interconnected nodes. The various nodes may be physically close together, or they may be widely separated.

The interconnect means comprises a conductor means that interconnects each of the nodes. The conductor means may be copper wires, such as twisted pairs or coaxial wires, fiber optic cables, or infrared emissions, for example. Signal transmission through the conductor means may be distorted due to deterioration over long distance, or interfering voltage or radiation fields that couple onto the conductor means, for example. A well known method of overcoming transmission distortion is the use of complimentary signals, in which the driving node drives both a signal and a compliment of the signal, where the compliment signal is typically an inversion of the signal. Transmission distortion then generally effects both signals in a common manner, which is referred to as "common mode distortion." The receiving nodes then compare the signal and the compliment signal so that the effects of common mode transmission distortion may be overcome.

Nodes that are interconnected with wire may be subject to differences in ground potential, referred to as "ground shift", between the nodes. When this occurs, a voltage signal impressed on the wire by the active driver circuit in a driving node may appear as a much larger voltage at the quiescent driver(s) of the receiving node(s).

Transmission distortion or ground shifts may cause the voltage on the terminals of a driver circuit to exceed the breakdown rating of the output transistors.

Accordingly, it is an object of the present invention to prevent voltage breakdowns in the driver circuit of an integrated circuit which has complimentary signal output terminals.

Another object of the invention is to provide a means for preventing voltage breakdowns in the driver circuit of an integrated circuit which has complimentary output terminals that requires less space on the integrated circuit than prior art solutions.

Other objects and advantages will be apparent to those of ordinary skill in the art having reference to the following figures and specification.

SUMMARY OF THE INVENTION

In accordance with the present invention, an integrated circuit for driving two complimentary signals comprises a means for preventing a voltage breakdown resulting from an externally supplied voltage on either signal terminal that is shared by the driver circuitry connected to each of the two complimentary signal terminals.

An advantage of the present invention is that a single device, such as a Schottky diode, can provide voltage breakdown protection for two complimentary signal drivers.

Another advantage of the present invention is that the single device can be made larger than if two devices were used so that a voltage drop across the device resulting from normal forward current conduction is minimized.

BRIEF DESCRIPTION OF THE DRAWINGS

Other features and advantages of the present invention will become apparent by reference to the following detailed description when considered in conjunction with the accompanying drawings, in which.

Corresponding numerals and symbols in the different figures and tables refer to corresponding parts unless otherwise indicated.

DETAILED DESCRIPTION OF THE INVENTION

A typical interconnect means for interconnecting multiple nodes is the Small Computer Systems Interface, referred to as "SCSI," an Institute of Electrical and Electronic Engineers (IEEE) standard. A typical SCSI application would be the interface between a SCSI hard disk drive and a host computer. The SCSI may be single ended, in which a single wire is used for each data channel transmitted from a driver to a receiver; or differential, in which two complimentary signals are used for each data channel. Differential SCSI receivers and drivers must meet the electrical requirements of RS485, an IEEE standard. One requirement of the SCSI standard is that the receivers and drivers, which may be combined and referred to as "transceivers", operate over a voltage range of −7 to +12 volts on the signal terminals. Typically, the driver is furnished with a supply voltage, referred to as $V_{cc}$, of 5 volts. When +12 volts is applied to the output terminal of a driver, it is possible for a voltage breakdown to occur across the output transistor to $V_{cc}$. The present invention is a means for preventing voltage breakdown when an externally provided voltage that exceeds the breakdown rating of the output transistor is applied to the output terminal of a driver circuit.

Figures 1A, 1B:
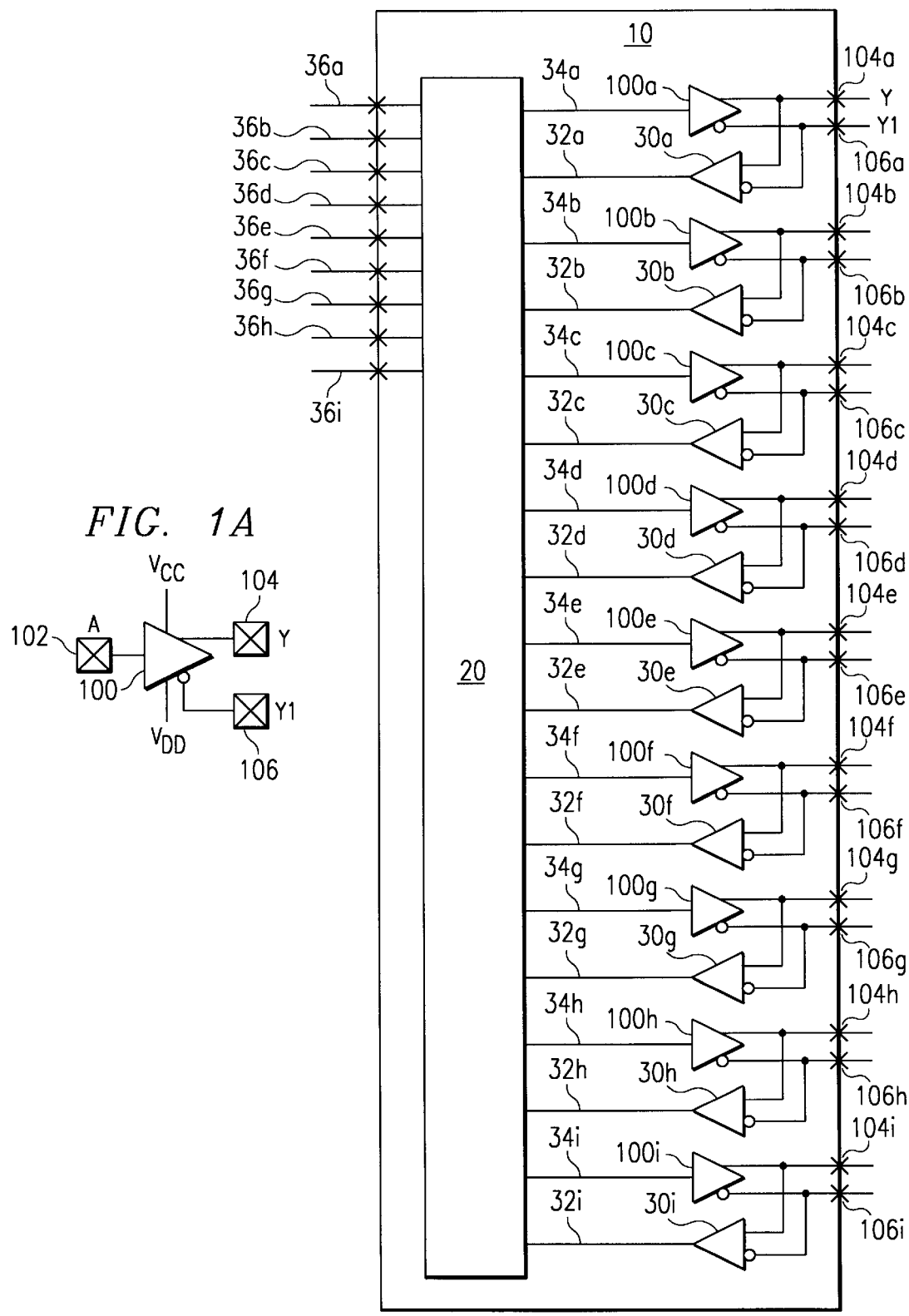
FIG. 1A is a driver circuit of an integrated circuit for driving two complimentary signals.
FIG. 1B is an integrated circuit containing a plurality of driver circuits shown in FIG. 1A.

FIG. 1A illustrates a differential driver circuit 100 of an integrated circuit for driving two complimentary signals which embodies the present invention. An externally generated signal A may be applied to input terminal 102. In response to signal A, driver circuit 100 drives a signal Y onto output terminal 104 and a complimentary signal Y1 onto output terminal 106. Driver 100 is powered by a supply voltage $V_{cc}$, which is typically 5 volts, and a supply voltage $V_{dd}$, which is typically 0 volts.

FIG. 1B illustrates an integrated circuit 10 having a plurality of drivers 100a–100i in combination with a plurality of differential receivers 30a–30i. In this manner, the integrated circuit can both transmit and receive data using the same terminal 104a and 106a, for example, as is well known in the art. A plurality of transmit signals 34a–34i and a plurality of received signals 32a–32i may be manipulated by processing logic 20 and connected to other processing logic via a plurality of signal lines 36a–36i.

Figure 2:
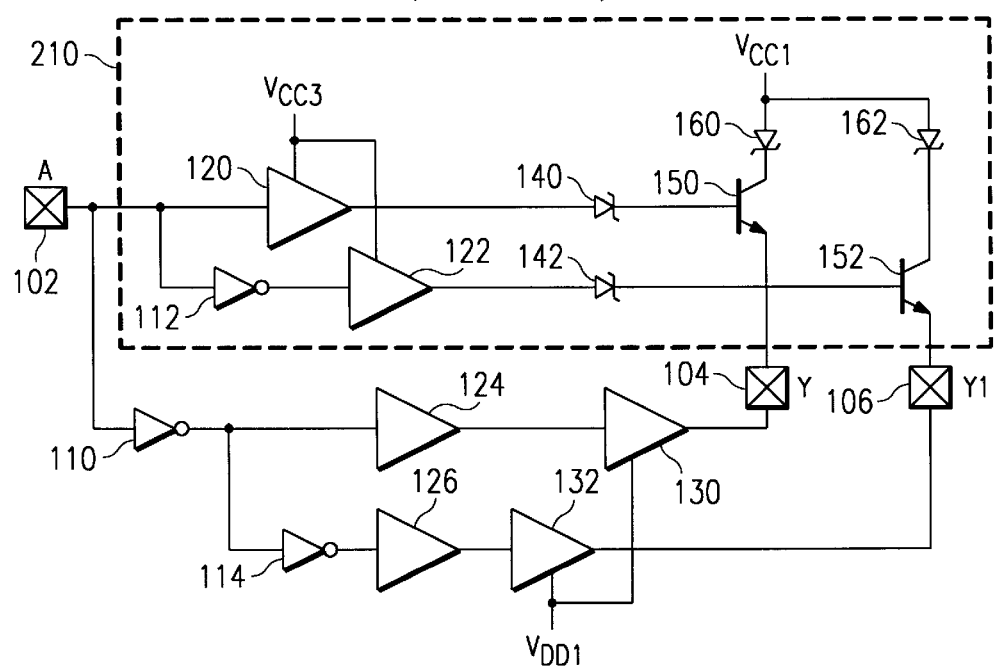
FIG. 2 is a prior art drawing of a driver circuit with voltage breakdown protection for each signal terminal.

FIG. 2 is a prior art drawing of a driver circuit 200 with voltage breakdown protection for each output transistor. High side circuit 210 drives a signal on output terminal 104 and a complimentary signal on terminal 106 in response to an external signal applied to terminal 102. Schottky diode 160 provides breakdown protection for high side output transistor 150, while Schottky diode 162 provides breakdown protection for complimentary high side output transistor 152.

Figure 3:
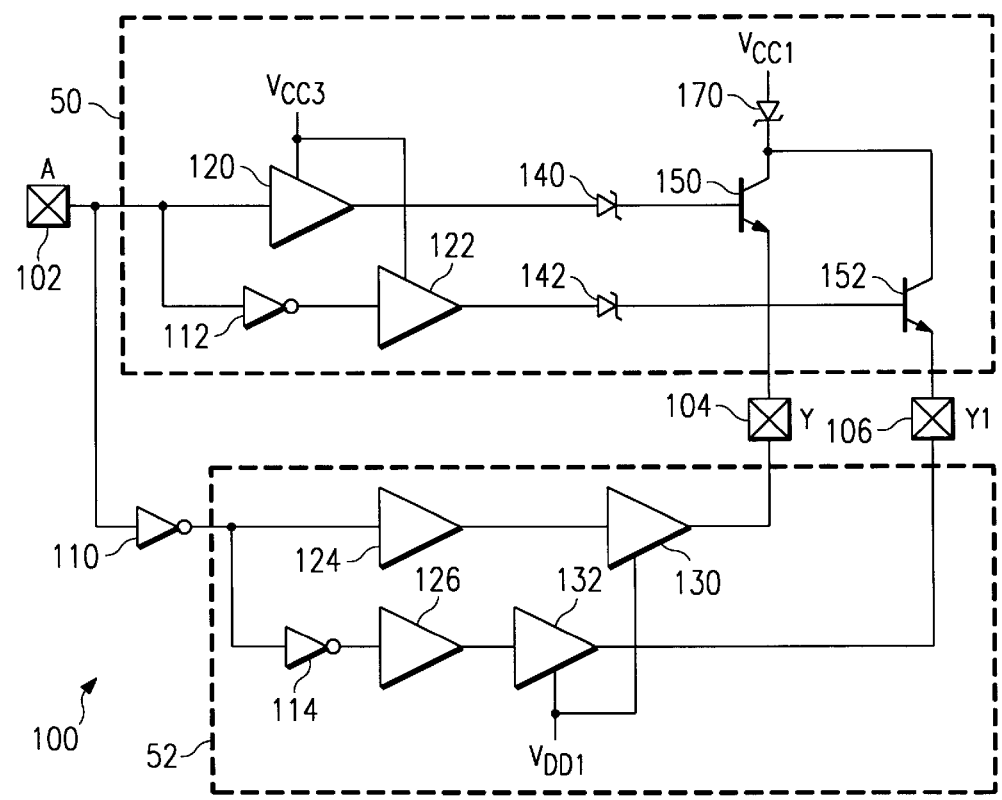
FIG. 3 illustrates a driver circuit with a shared voltage breakdown protection device according to the present invention.

FIG. 3 illustrates driver circuit 100 with a shared voltage breakdown protection device according to the present invention. High side circuit 50 drives a high signal on output terminal 104 and a complimentary high signal on terminal 106 in response to an external signal applied to terminal 102. Low side circuit 52 drives a low signal on output terminal 104 and a complimentary low signal on terminal 106 in response to the external signal applied to terminal 102. According to the present invention, Schottky diode 170 provides breakdown protection for high side output transistor 150 and also for complimentary high side output transistor 152.

Continuing to refer to FIG. 3, input terminal 102 is connected to an input of preamplifier 120 and to an input of inverter 112 of high side circuit 50. An output of inverter 112 is connected to an input of preamp 122, so that an output of preamp 122 is the compliment of an output of preamp 120. That is, when the output of preamp 120 is a logic high in response to an external signal on input terminal 102, the output of preamp 122 is a logic low, and vice versa. Supply voltage $V_{cc3}$ is connected to preamps 120, 122. Typically, $V_{cc3}$ is approximately 5 volts. The output of preamp 120 is connected to the cathode of Schottky diode 140, and the output of preamp 122 is connected to the cathode of Schottky diode 142. The anode of Schottky diode 140 is connected to the base of high side output transistor 150. The anode of Schottky diode 142 is connected to the base of side output transistor 152. A supply voltage, $V_{cc1}$, is connected to the cathode of Schottky diode 170. Supply voltage $V_{cc1}$ is typically 5 volts. The anode of Schottky diode 170 is connected to the collector of output transistor 150 and also to the collector of output transistor 152. The emitter of transistor 150 is connected to output terminal 104, and the emitter of output transistor 152 is connected to output terminal 106. Thus, when transistor 150 is turned on in response to a signal on terminal 102, output terminal 104 is connected to $V_{cc1}$. When transistor 150 is turned off, terminal 104 is isolated from $V_{cc1}$ by transistor 150. Likewise, when transistor 152 is turned on in response to a signal on terminal 102, output terminal 106 is connected to $V_{cc1}$. When transistor 152 is turned off, terminal 106 is isolated from $V_{cc1}$ by transistor 152. In operation, when transistor 150 is on, transistor 152 will be off, and vice versa.

Continuing to refer to FIG. 3, input terminal 102 is also connected to an input of inverter 110. An output of invertor 110 is connected to an input of preamp 124 and to an input of inverter 114 of low side circuit 52. An output of inverter 114 is connected to an input of preamp 126, so that an output of preamp 126 is the compliment of an output of preamp 124. The output of preamp 124 is connected to an input of low side driver 130. An output of preamp 126 is connected to an input of complimentary low side driver 132. A supply voltage, $V_{dd1}$, is connected to drivers 130 and 132. Supply voltage $V_{dd1}$ is typically 0 volts. An output of driver 130 is connected to output terminal 104 and an output of driver 132 is connected to output terminal 106. Drivers 130, 132 are open collector type drivers with internal voltage breakdown protection. Such drivers are well known in the art. When driver 130 is on, terminal 104 is connected to $V_{dd1}$. When driver 130 is off, the output of driver 130 is in a high impedance state. Likewise, when driver 132 is on, terminal 106 is connected to $V_{dd1}$. When driver 132 is off, the output of driver 132 is in a high impedance state. In operation, when output transistor 150 is on, output driver 130 will be off, and vice versa. Likewise, when output transistor 152 is on, output driver 132 will be off, and vice versa.

The circuit illustrated in FIG. 3 may be subject to a voltage that exceeds the breakdown rating of transistors 150, 152 applied to terminal 104 or 106 from an external source. Schottky diode 170 prevents voltage breakdown through transistor 150 and 152 to $V_{cc1}$ when the voltage on terminal 104 or 106 becomes excessive. Transistors 150, 152 may have a breakdown voltage of approximately eight volts for example, whereas the Schottky diode may have a breakdown voltage of greater than twelve volts, such as 80 volts for example. Schottky diode 170 prevents the flow of an excessive breakdown current through either of transistors 150, 152 so that transistors 150, 152 are not damaged when an excessive voltage is applied to either of output terminals 104, 106. Schottky diode 140 prevents voltage breakdown through transistor 150 and preamp 120 to $V_{cc3}$. Likewise, Schottky diode 142 prevents voltage breakdown through transistor 152 and preamp 122 to $V_{cc3}$. Schottky diodes 140, 142 may be small because they conduct a low current. Output drivers 130, 132 have internal voltage breakdown protection.

Diode 170 is physically very large because it must handle upwards of 50 ma in normal operation with a very small forward voltage drop. The low forward voltage drop is necessary to meet output voltage specifications on terminals 104, 106 without saturating output transistors 150, 152. It is advantageous not to saturate output transistors 150, 152 in order to minimize switching time. A heretofore unappreciated condition is that only one output transistor 150, 152 is on and drawing current at any given time. According to the present invention, a single large Schottky diode 170 can provide breakdown protection for both output transistors 150, 152. Shared diode 170 advantageously only needs to carry current for one output transistor at a time. Otherwise, diode 170 would have to be twice as large to keep a low forward voltage drop.

Figure 4:
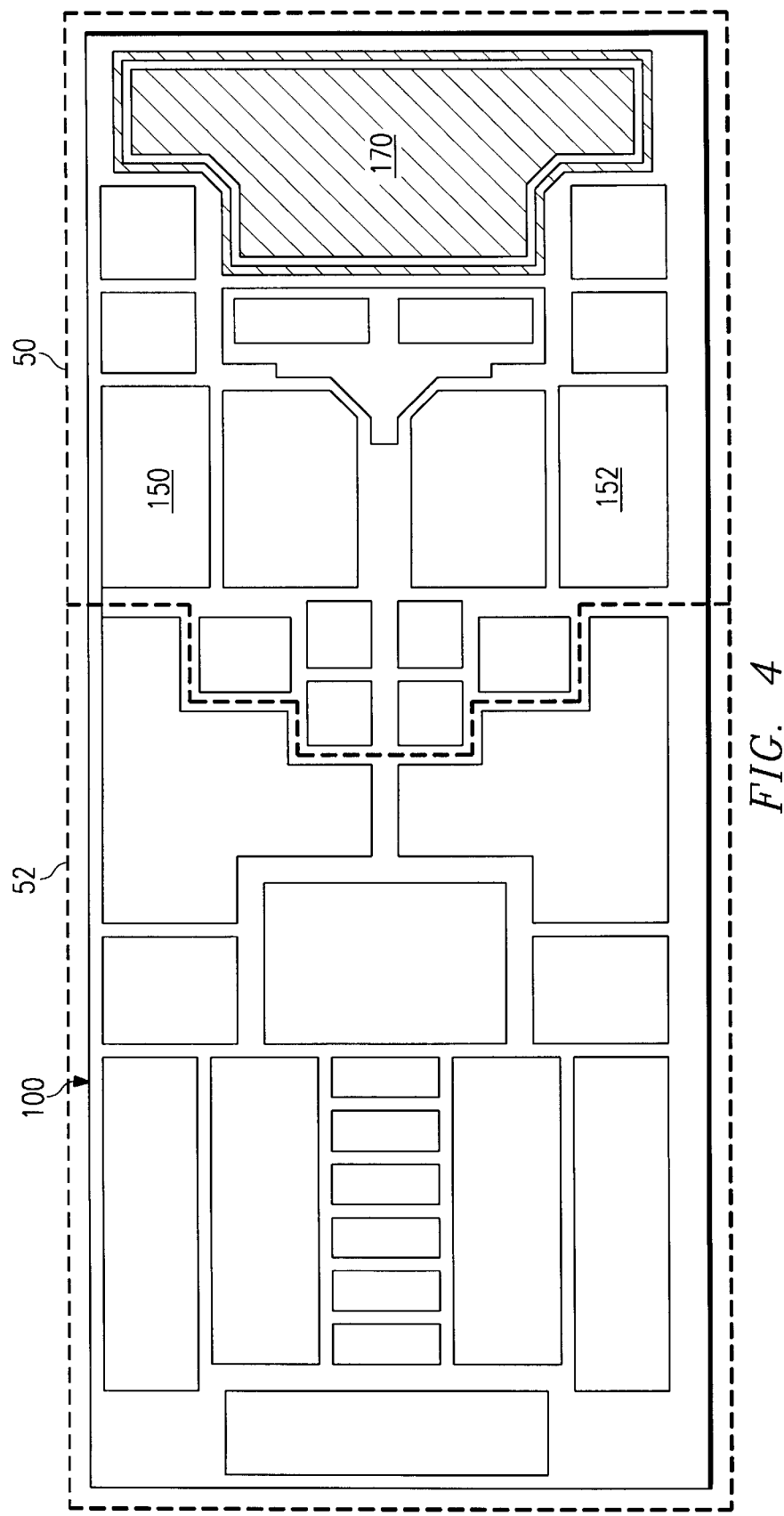
FIG. 4 illustrates an integrated circuit layout of the driver of FIG. 3.

FIG. 4 illustrates the layout of driver circuit 100 with a shared voltage breakdown protection device 170 according to the present invention. The area 50 enclosed in a dashed line is the high side circuit of FIG. 3. Schottky diode 170 is physically very large because it must handle upwards of 50 ma in normal operation with a very small forward voltage drop. If two diodes where used for voltage breakdown protection, such as diodes 160, 162 in prior art differential driver 200, significantly more space on the integrated circuit would be required.

The present invention can be advantageously applied to many types of integrated circuits that contain complimentary output drivers to provide voltage breakdown protection for each pair of output transistors so that the output transistors are not damaged when an excessive voltage is applied to an output terminal. The present invention can be advantageously applied to driver circuits that operate in a complimentary binary mode where the output is either high or low.

The present invention can also be advantageously applied to differential driver circuits that operate in a linear mode where as the current to one terminal increases the current to the other terminal decreases such that the total current supplied by both of the differential output drivers remains approximately constant.

The means for driving a signal on the output terminal may be an NPN or PNP transistor, an N channel MOS (NMOS) or P channel MOS (PMOS) device, or another type of semiconductor device.

Another feature of the present invention is that the means for preventing voltage breakdown may be a Schottky diode, a conventional diode, a PNPN thyrister device, or another type of voltage blocking device.

Another advantage of the present invention is that significantly less space is required on the integrated circuit to provide voltage breakdown protection than was required by prior art circuits. Therefore, more driver circuits can be placed on a single integrated circuit than could be done with prior art driver circuits. Alternatively, an integrated circuit using driver circuits embodied according to the present invention can be smaller and therefore less expensive than an integrated circuit using prior art driver circuits.

Another advantage of the present invention is that by sharing a single Schottky diode, the Schottky diode may be made larger than if two Schottky diodes where used. A larger Schottky diode will result in a lower voltage drop across the Schottky diode which may allow smaller output transistors to be used while still providing a high enough output voltage on the output terminals.

As used herein, the terms "applied," "connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. An integrated circuit for driving complimentary signals on two terminals comprising:
    a first means for driving a signal on a first output terminal,
    a second means for driving a complimentary signal on a second output terminal, and
    a shared means for preventing the flow of a damaging breakdown current in either driving means resulting from an excessive externally supplied voltage on either output terminal.

2. The integrated circuit of claim 1, in which:
    the shared means for preventing a voltage breakdown is a Schottky diode having a cathode connected to a supply voltage terminal and an anode connected to the first means for driving a signal and to the second means for driving a complimentary signal.

3. The integrated circuit of claim 1, in which:
    the first means for driving a signal is a bipolar transistor having a current path coupled between the shared means for preventing a voltage breakdown and the first output terminal, and a control electrode for receiving an intermediate signal; and the second means for driving a complimentary signal is a second bipolar transistor having a current path coupled between the shared means for preventing a voltage breakdown and the second output terminal, and a control electrode for receiving a complimentary intermediate signal.

4. The integrated circuit of claim 1, in which:
    the first means for driving a signal is an NPN transistor having a collector connected to the shared means for preventing a voltage breakdown, an emitter connected to the first output terminal, and a base for receiving an intermediate signal; and
    the second means for driving a complimentary signal is a second NPN transistor having a collector connected to the shared means for preventing a voltage breakdown, an emitter connected to the second output terminal, and a base for receiving a complimentary intermediate signal.

5. An integrated circuit for driving two complimentary signals comprising:
    a Schottky diode having a cathode connected to a supply voltage terminal and an anode,
    a first transistor having a current path coupled between the anode of the Schottky diode and a first output terminal and having a control electrode for receiving an intermediate signal, and
    a second transistor having a current path coupled between the anode of the Schottky diode and a second output terminal and having a control electrode for receiving a complimentary intermediate signal.

6. The integrated circuit of claim 5, in which:
    the first transistor is a bipolar transistor, and
    the second transistor is a bipolar transistor.

7. The integrated circuit of claim 5, in which:
    the first transistor is an NPN transistor having a collector connected to the anode of the Schottky diode, an emitter connected to the first output terminal, and a base for receiving the intermediate signal; and
    the second transistor is an NPN transistor having a collector connected to the anode of the Schottky diode, an emitter connected to the second output terminal, and a base for receiving the complimentary intermediate signal.

8. An integrated circuit for driving a plurality of complimentary signals comprising:
    a plurality of differential driver circuits, each differential driver circuit comprising:
        a first means for driving a signal on a first output terminal,
        a second means for driving a complimentary signal on a second output terminal, and
        a shared means for preventing the flow of a damaging breakdown current in either driving means resulting from an excessive externally supplied voltage on either output terminal.

9. The integrated circuit of claim 8, in which:
    the shared means for preventing a voltage breakdown is a Schottky diode having a cathode connected to a supply voltage terminal and an anode connected to the first means for driving a signal and to the second means for driving a complimentary signal.

10. The integrated circuit of claim 8, in which:
    the first means for driving a signal is a bipolar transistor having a current path coupled between the shared means for preventing a voltage breakdown and the first output terminal, and a control electrode for receiving an intermediate signal; and the second means for driving a complimentary signal is a second bipolar transistor having a current path coupled between the shared means for preventing a voltage breakdown and the second output terminal, and a control electrode for receiving a complimentary intermediate signal.

11. The integrated circuit of claim 8, in which:

the first means for driving a signal is an NPN transistor having a collector connected to the shared means for preventing a voltage breakdown, an emitter connected to the first output terminal, and a base for receiving an intermediate signal; and the second means for driving a complimentary signal is a second NPN transistor having a collector connected to the shared means for preventing a voltage breakdown, an emitter connected to the second output terminal, and a base for receiving a complimentary intermediate signal.

12. The integrated circuit of claim 8, each differential driver circuit further comprising:

a complimentary receiving means having a first input connected to said first output terminal and a second complimentary input connected to said second output terminal.

13. The integrated circuit of claim 8, in which:

said first means for driving a signal comprises a first high side driver having an output connected to said first output terminal and a first low side driver having an output connected to said first output terminal; and said second means for driving a signal comprises a second high side driver having an output connected to said first output terminal and a second low side driver having an output connected to said second output terminal.

* * * * *